(12) United States Patent
Ueno et al.

(10) Patent No.: US 7,217,960 B2
(45) Date of Patent: May 15, 2007

(54) SEMICONDUCTOR DEVICE

(75) Inventors: Hiroaki Ueno, Ibaraki (JP); Tetsuzo Ueda, Toyonaka (JP); Yasuhiro Uemoto, Otsu (JP); Daisuke Ueda, Ibaraki (JP); Tsuyoshi Tanaka, Neyagawa (JP); Manabu Yanagihara, Toyonaka (JP); Yutaka Hirose, Nagaokakyo (JP); Masahiro Hikita, Ashiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/325,340

(22) Filed: Jan. 5, 2006

(65) Prior Publication Data

US 2006/0157729 A1  Jul. 20, 2006

(30) Foreign Application Priority Data

Jan. 14, 2005 (JP) .............................. 2005-007807

(51) Int. Cl.
*H01L 33/00* (2006.01)
(52) U.S. Cl. .................. 257/103; 257/183; 257/196; 257/E33.032
(58) Field of Classification Search ................ 257/103, 257/183, 194
See application file for complete search history.

(56) References Cited

U.S. PATENT DOCUMENTS 6,177,685 B1 * 1/2001 Teraguchi et al. ............ 257/20

FOREIGN PATENT DOCUMENTS

| JP | 10173203 | 6/1998 |
|---|---|---|
| JP | 2000277724 | 10/2000 |
| JP | 2002016245 | 1/2002 |
| JP | 2003197645 | 7/2003 |

\* cited by examiner

*Primary Examiner*—Andy Huynh
*Assistant Examiner*—Thinh T Nguyen
(74) *Attorney, Agent, or Firm*—Stevens, Davis, Miller & Mosher, LLP

(57) ABSTRACT

It is an object of the present invention to provide a semiconductor device, which can simultaneously achieve a normally-off mode of HFET and an improvement in $I_{max}$, and further achieve an improvement in $g_m$ and a reduction in gate leakage current. In order to keep a thin barrier layer 13 on an operation layer 12 of a substrate 11 directly under a gate electrode for mostly contributing to achieve the normally-off mode and also implement the high $I_{max}$, it is configured in such a way that a thickness of the barrier layer 13 can be increased by the semiconductor layer 17 between gate and source regions and between gate and drain regions. It is therefore possible to achieve the normally-off mode and an improvement in $I_{max}$ as compared with an FET in which a thickness of the barrier layer is designed so as to be uniform. An insulating film 18 with a dielectric constant higher than that of the barrier layer is further inserted between a gate electrode 16 and the barrier layers 13, so that an improvement in $g_m$ and a reduction in gate leakage current can be achieved.

10 Claims, 5 Drawing Sheets

| INSULATING FILM THICKNESS OF | 0nm | 5nm | 15nm | 30nm | 50nm |
|---|---|---|---|---|---|
| LEAKAGE CURRENT (A/mm) | 0.4 | 2.00E-04 | 3.00E-07 | 4.00E-09 | 5.00E-11 |
| gm(S/mm) | 0.2 | 0.18 | 0.15 | 0.08 | 0.03 |

RELATED ART

SEMICONDUCTOR DEVICE

BACKGROUND OF THE INVENTION

1. Field of the Invention

The present invention relates to a semiconductor device using a group III nitride semiconductor.

2. Background Art

A group III nitride semiconductor is a compound semiconductor composed of a compound of aluminum (Al), boron (B), gallium (Ga) or indium (In), and nitrogen (N), described by a general formula, $B_wAl_xGa_yIn_zN$ (w+x+y+z=1; 0<=w, x, y, z<=1).

Since the group III nitride semiconductor has advantages such as a large band gap and a high breakdown voltage accompanying therewith, a high electron saturated velocity and a high electron mobility, and a high concentration of electrons in a heterojunction, research and development thereof have been conducted to apply a group III nitride semiconductor to a short-wavelength light emitting device, a high-power high-frequency device, a high-frequency low-noise amplifying device, a power switch of a power source system, or the like. Especially, a heterojunction structure in which the group III nitride semiconductor layers having different composition ratios of group III elements and different band gaps are stacked, a quantum well structure or a super-lattice structure in which a plurality of the heterojunction structures are stacked are capable of controlling a modulation degree of the concentration of electrons in the device, and thus may be utilized as a basic structure for the devices described above.

Figure 5:
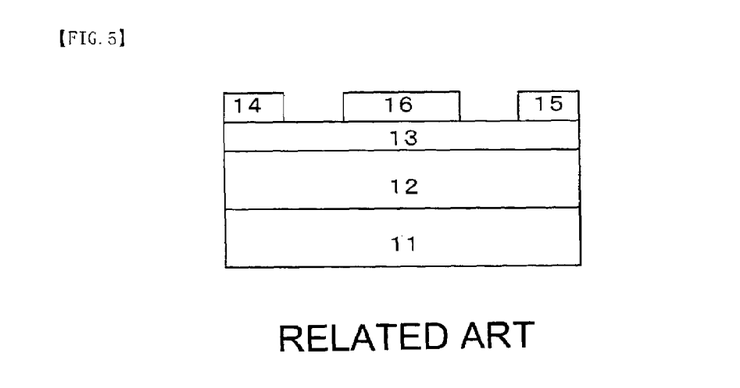
FIG. 5 is a sectional view showing a conventional group III nitride system semiconductor device.

FIG. 5 shows the most common form utilizing the heterojunction in the conventional nitride semiconductor device. In FIG. 5, on a substrate 11, an operation layer 12 made of gallium nitride (GaN) and a barrier layer 13 made of aluminum gallium nitride (AlGaN) are stacked in that order, wherein a heterojunction is formed at an interface where the operation layer 12 and the barrier layer 13 having band gaps different from each other are stacked thereon.

On the barrier layer 13, a source electrode 14, a drain electrode 15, and a gate electrode 16 are formed so as to operate as a Heterojunction Field Effect Transistor (hereinafter, abbreviated as HFET). The gate electrode 16 and the barrier layer 13 form a Schottky barrier. At the heterojunction interface between the barrier layer 13 and the operation layer 12, highly concentrated electrons resulting from a difference of spontaneous polarizations and a difference of piezo polarizations between the barrier layer 13 and the operation layer 12, n-type impurities doped in the barrier layer 13 according to the need, and other uncontrollable defects in the semiconductor layers are accumulated. As a result, a two-dimensional electron gas (2DEG) is formed at the heterojunction interface, in which the (2DEG) operates as a channel carrier of the field effect transistor.

One of the performance indexes for such HFET is a threshold voltage (hereinafter, referred to as $V_p$). Based on the $V_p$, value being positive or negative, an operational mode of the HFET is classified as a normally-off (enhancement) mode or a normally-on (depletion) mode. In the normally-on mode, even when the voltage applied to the gate electrode is 0 V, a current flows through the source and drain electrodes, so that the source and drain electrodes are short-circuited even during a power failure, and as a result, it is not suitable for use as a switch for the power source system. Conventionally, the general HFET operates in the normally-on mode, and thus it is preferably modified to operate in the normally-off mode. As one of the methods of modifying the HFET using the group III nitride semiconductor to operate in the normally-off mode, a method of reducing a thickness of the barrier layer 13 is publicly known (for example, see Japanese Unexamined Patent Publication No. 2000-277724).

Another performance index of the HFET is a maximum current value (hereinafter, referred to as $I_{max}$), which is preferable to be as high as possible. This is because the higher $I_{max}$ value allows the large current to be secured even when a gate width is narrow.

Still another performance index of the HFET is a gate-drain transconductance (hereinafter, referred to as $g_m$), in which the $g_m$ is preferably as high as possible. The reason that a high $g_m$ is preferable is because a higher $g_m$ value results in a larger change in a signal input to the drain with respect to the change in a signal input to the gate, allowing an improvement in the degree of amplification of the signal.

Yet still another performance index of the HFET is a leakage current from the gate electrode, wherein it is preferable that the leakage current is as small as possible. The reason that it is preferable to have a leakage current in the HFET be as small as possible is because, when the leakage current flows through the gate electrode, a current output to the drain electrode is reduced and the current flows through a region where the current inherently should not flow, resulting in a problem with the operation of a circuit or the like.

It is, however, impossible to satisfy the four performance indexes of the HFET described above at once in the HFET that uses the conventional group III nitride semiconductor. The reasons thereof will be hereinbelow described. In order to modify the HFET to operate in the normally-off mode, it is required to reduce the thickness of the barrier layer 13 directly under the gate electrode, to decrease an impurity concentration in the barrier layer 13, or to decrease an aluminum composition ratio of the barrier layer 13. Meanwhile, in order to increase $I_{max}$ it is required to increase the thickness of the barrier layer 13, to increase the impurity concentration in the barrier layer 13, or to increase the aluminum composition ratio of the barrier layer 13. Moreover, an increase in $g_m$ is achieved by increasing a capacitance per unit area directly under the gate electrode. In order to achieve it, to a reduction is required in the thickness of the barrier layer 13 directly under the gate electrode. Meanwhile, the greater the thickness of the barrier layer 13 directly under the gate electrode, or the larger the height of the bottom of a conduction band of the barrier layer 13, the further the gate leakage current may be reduced. The reason that the gate leakage current may be further reduced is because the gate leakage current is caused by a tunneling phenomena, so that the smaller the thickness of the barrier layer, and the smaller the height of the barrier, the more likely the tunneling tends to occur.

SUMMARY OF THE INVENTION

The present invention is intended to solve, inter alia, previously known problems associated with satisfying the four performance indexes described above at the same time in an HFET that uses the above-described conventional group III nitride semiconductor.

A semiconductor device according to the present invention is provided with a substrate on which a first group III nitride semiconductor layer serving as an operation layer is formed, a second group III nitride semiconductor layer composed of a single layer or a plurality of layers, the second group III nitride semiconductor layer being formed on the first group III nitride semiconductor layer and functioning as a barrier layer, a third group III nitride semiconductor layer which is not formed only at a gate forming region on the second group III nitride semiconductor layer, a first electrode which is formed on the third group III nitride semiconductor layer and functions as a source, a second electrode which is formed on the third group III nitride semiconductor layer and functions as a drain, an insulating film layer formed on the second and third group III nitride semiconductor layers between the first electrode and the second electrode, and a third electrode (gate) which is formed on the insulating film layer and controls a current flowing between the first electrode and the second electrode, wherein the second group III nitride semiconductor layer contains aluminum, and has a thickness and an aluminum composition ratio that are controlled so that, in the state where a voltage is not applied to the third electrode with respect to the first electrode, an energy at the bottom of a conduction band on a surface of the first group III nitride semiconductor layer directly under the third electrode is higher than a Fermi energy in the location.

According to the aforementioned configuration, by taking the configuration where the barrier layer is made to be thin only directly under the third electrode, $V_P$ can have a positive value, a short-circuit does not occur between the first and second electrodes in the state where the voltage is not applied to the third electrode with respect to the first electrode. At the same time, since there exists the barrier layer having the same thickness as that of the conventional HFET at the location other than directly under the third electrode, the maximum current value $I_{max}$ has never been changed from that conventionally achieved, while the higher transconductance $g_m$ compared with that of the conventional general HFET can be achieved and a leakage current to the third electrode can be reduced. In other words, a channel is completely depleted without the voltage being applied to the third electrode (gate electrode) with respect to the first electrode (source electrode), while a gate-source channel and a gate-drain channel are not depleted and the insulating film layer can be formed under the gate electrode. Hence, as compared with the HFET using the conventional group III nitride semiconductor, $V_P$ can have a positive value, high $I_{max}$ and $g_m$ can be achieved, and a gate leakage current can be reduced.

In the aforementioned configuration, impurities are doped in the third group III nitride semiconductor layer.

According to the aforementioned configuration, when the impurities are doped in the third group III nitride semiconductor layer, a concentration of the two-dimensional electron gas (2DEG) in the channel portion is increased, so that the maximum current value $I_{max}$ can be increased.

In the aforementioned configuration, the third group III nitride semiconductor layer contains aluminum, wherein the aluminum composition ratio thereof is equal to or higher than that of the second group III nitride semiconductor layer.

According to the aforementioned configuration, when the aluminum composition ratio of the third group III nitride semiconductor layer is greater than that of the second group III nitride semiconductor layer, the concentration of the two-dimensional electron gas (2DEG) in the channel portion is increased, so that the maximum current value $I_{max}$ can be increased.

In the aforementioned configuration, a dielectric constant of the insulating film layer is larger than that of the second group III nitride semiconductor layer.

In the aforementioned configuration, the insulating film layer may be a strontium titanate (STO), barium titanate strontium (BST), hafnium oxide ($HfO_2$), aluminum oxide ($Al_2O_3$), magnesium oxide (MgO), aluminum nitride (AlN), zirconium oxide ($ZrO_2$), or gallium nitride oxide ($GaN_xO_y$) thin film.

In the aforementioned configuration, the thickness of the insulating film layer is equal to or more than 5 nm and equal to or less than 30 nm.

According to the aforementioned configuration, when the thickness of the insulating film layer is equal to or more than 5 nm and equal to or less than 30 nm, the higher transconductance $g_m$ compared with that of the conventional general HFET can be achieved and the leakage current to the third electrode can be reduced.

Another semiconductor device according to the present invention is provided with a substrate on which a first group III nitride semiconductor layer serving as an operation layer is formed, a second group III nitride semiconductor layer composed of a single layer or a plurality of layers, the second group III nitride semiconductor layer being formed on the first group III nitride semiconductor layer and functioning as a barrier layer, a third group III nitride semiconductor layer which is not formed only at a gate forming region on the second group III nitride semiconductor layer, a first electrode which is formed on the third group III nitride semiconductor layer and functions as a source, a second electrode which is formed on the third group III nitride semiconductor layer and functions as a drain, a first insulating film layer which is formed on the second and third group III nitride semiconductor layers between the first electrode and the second electrode and has a high dielectric breakdown voltage, a second insulating film layer which is formed on the first insulating film layer and has a dielectric constant higher than that of the second group III nitride semiconductor layer, a third electrode (gate) which is formed on the insulating film layer and controls a current flowing between the first electrode and the second electrode, wherein the second group III nitride semiconductor layer contains aluminum, and has a thickness and an aluminum composition ratio that are controlled so that, in the state where a voltage is not applied to the third electrode with respect to the first electrode, an energy at the bottom of a conduction band on a surface of the first group III nitride semiconductor layer directly under the third electrode is higher than a Fermi energy in the location.

According to the aforementioned configuration, since it includes the first insulating film layer having the high dielectric breakdown voltage and the second insulating film layer thereon having the dielectric constant higher than that of the second group III nitride between the first and second electrodes, the threshold voltage $V_P$ can have a positive value, a short-circuit does not occur between the first and second electrodes in the state where the voltage is not applied to the third electrode with respect to the first electrode. At the same time, the higher transconductance $g_m$ compared with that of the conventional general HFET can be achieved, a leakage current to the third electrode can be reduced, and a breakdown voltage between the second and third electrodes can be improved.

In the aforementioned configuration, the first insulating film layer may be a silicon oxide ($SiO_2$), silicon nitride ($Si_3N_4$), or organic polymer (BCB, BCN) thin film.

Still another semiconductor device according to the present invention is provided with a substrate on which a first group III nitride semiconductor layer serving as an operation layer is formed, a second group III nitride semiconductor layer composed of a single layer or a plurality of layers and contains aluminum, which is formed on the first group III nitride semiconductor layer and functions as a barrier layer, a first electrode which is formed on said second group III nitride semiconductor layer and functions as a source, a second electrode which is formed on the second group III nitride semiconductor layer and functions as a drain, a third group III nitride semiconductor layer which is formed on the second group III nitride semiconductor layer between the first electrode and the second electrode and contains aluminum so that the aluminum composition ratio thereof is lower than that of the second group III nitride semiconductor layer, and a third electrode which is formed on the third group III nitride semiconductor layer and controls a current flowing between the first electrode and the second electrode, wherein the second group III nitride semiconductor layer has a thickness and an aluminum composition ratio that are controlled so that, in the state where the voltage is not applied to the third electrode with respect to the first electrode, an energy at the bottom of a conduction band on a surface of the first group III nitride semiconductor layer directly under the third electrode is higher than a Fermi energy in the location.

According to the aforementioned configuration, since it includes, between the first electrode and the second electrode, the third group III nitride semiconductor layer having the aluminum composition ratio lower than that of the second group III nitride semiconductor layer, and the third electrode (gate) thereon which controls the current flowing between the first and second electrodes, the threshold voltage $V_P$ can have a positive value, a short-circuit does not occur between the first and second electrodes in the state where the voltage is not applied to the third electrode with respect to the first electrode, and a leakage current to the third electrode can be reduced.

In the aforementioned configuration, nickel (Ni), palladium (Pd), palladium silicon (PdSi), platinum (Pt), gold (Au), or alloys or multilayer films composed of them may be used as the third electrode.

According to the aforementioned configuration, when a metal such as nickel (Ni), palladium (Pd), palladium silicon (PdSi), platinum (Pt), or gold (Au) is used as a material of the third electrode, a Schottky barrier of the third electrode can be set higher than the conventional are, thereby the leakage current to the third electrode can be reduced.

PREFERRED EMBODIMENT OF THE INVENTION (First Embodiment)

Referring to FIG. 1A through FIG. 1F, a semiconductor device according to a first embodiment of the present invention will be described.

Figure 1A:
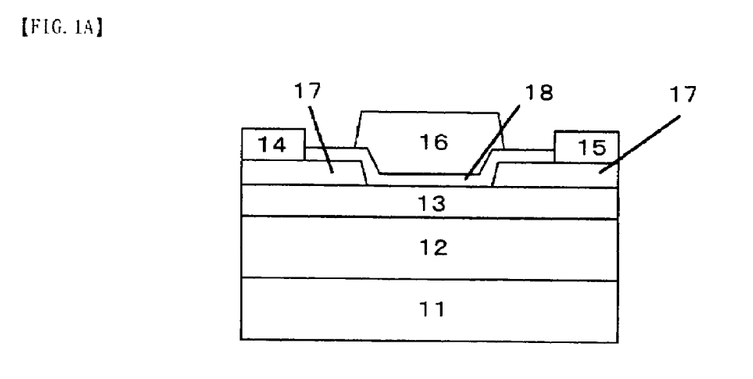
FIG. 1A is a sectional view showing a semiconductor device according to a first embodiment of the present invention.

FIG. 1A schematically shows a cross section of the semiconductor device according to the present embodiment.

As shown in FIG. 1A, on an operation layer 12 composed of GaN formed on a substrate 11, a barrier layer 13 composed of $Al_xGa_{(1-x)}N$ (0<x<1), which has a thickness and an aluminum composition ratio such that an energy at the bottom of a conduction band on a surface of the operation layer 12 directly under a gate electrode is higher than a Fermi energy in that location, is stacked, and a heterojunction interface is formed of the operation layer 12 and the barrier layer 13. On the barrier layer 13, a semiconductor layer 17 composed of $Al_yGa_{(1-y)}N$ (0<y<1) is further stacked, a source ohmic electrode 14 and a drain ohmic electrode 15 are formed thereon apart from each other, an insulating film 18 is formed between the source ohmic electrode 14 and the drain ohmic electrode 15, and a gate electrode 16 is formed thereon. It should be noted that, in the present embodiment, the semiconductor layer 17 is not stacked in a portion where the gate electrode 16 is formed.

Figure 1B:
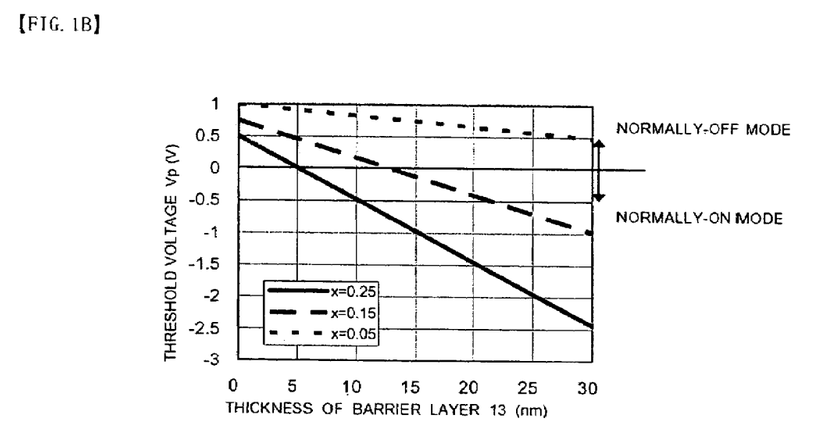
FIG. 1B is a graph showing a relationship between a thickness of a barrier layer and an aluminum composition ratio, and a threshold voltage $V_P$ according to the present invention.

FIG. 1B shows a relation between a thickness and an aluminum composition ratio x, and a threshold voltage $V_p$ of the barrier layer 13 when an impurity concentration of the barrier layer 13 is set to be 0 in the semiconductor device according to the present embodiment. As will be clear from FIG. 1B, it has been confirmed that $V_p$ takes a positive value by a certain combination of the thickness and the aluminum composition ratio x of the barrier layer 13.

Figure 1C:
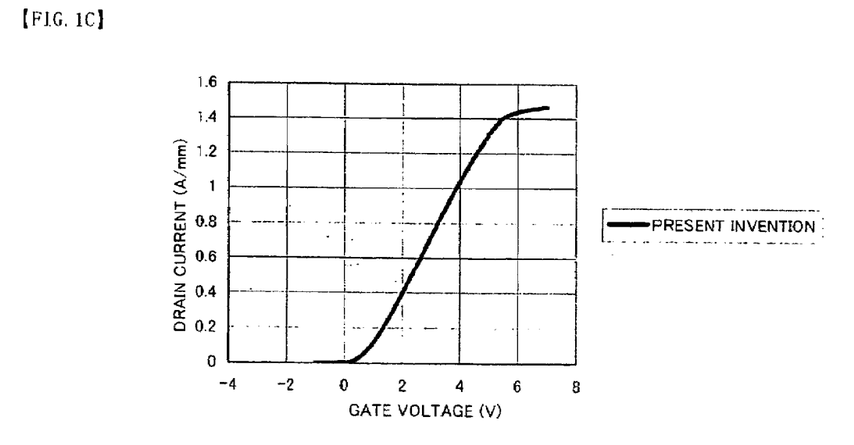
FIG. 1C is a graph showing a drain current-gate voltage characteristic of the semiconductor device according to the present invention.

FIG. 1C shows a drain current-gate voltage ($I_{ds}$-$V_{gs}$) curve at a drain voltage ($V_{ds}$) of 10 V when the thickness and the aluminum composition ratio x of the barrier layer 13 are set 5 nm and 0.25, respectively, in the semiconductor device according to the present embodiment.

Figure 1D:
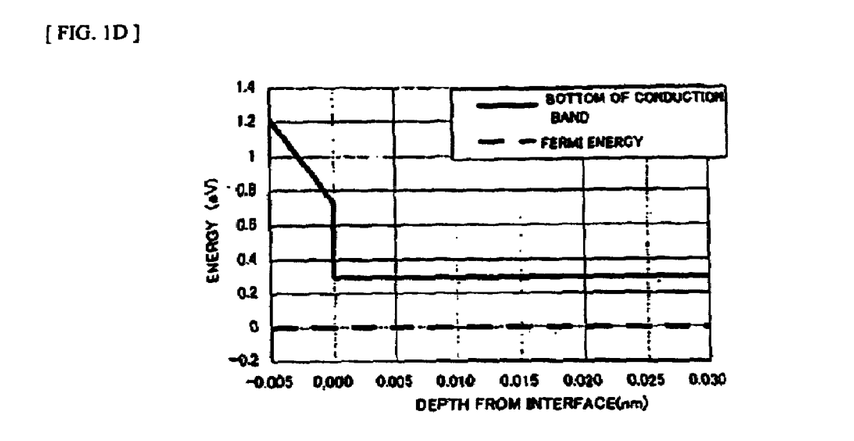
FIG. 1D is a diagram showing an energy band directly under a gate electrode when a gate voltage is 0 V.

FIG. 1D shows an energy-band diagram near a heterojunction composed of the operation layer 12 and the barrier layer 13 directly under the gate electrode when the gate voltage is 0 V under above conditions. As will be understood from the above description, in the semiconductor device of the present embodiment, if the thickness, the impurity concentration, and the aluminum composition ratio of the barrier layer 13 meet certain conditions, then an energy at the bottom of a conduction band on the surface of the operation layer 12 directly under the gate electrode will be higher than a Fermi energy in that location. According to FIG. 1C, the semiconductor device can be brought into a normally-off mode under conditions to achieve FIG. 1D.

In addition, if the structure in which impurities are doped in the semiconductor layer 17 is employed, the concentration of a two-dimensional electron gas (2DEG) of a channel can be increased by the presence of the impurities. This makes it possible to achieve $I_{max}$ higher than that of the aforementioned structure without the impurities.

Figure 1E:
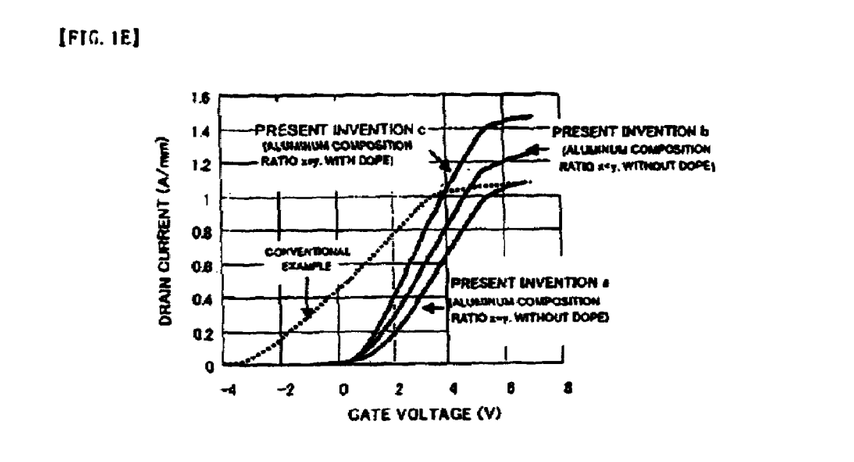
FIG. 1E is a graph showing drain current-gate voltage characteristics of the semiconductor device according to the present invention and a semiconductor device according to a conventional art.

FIG. 1E shows a drain current-gate voltage ($I_{ds}$-$V_{gs}$) curve where both of the semiconductor device according to the present embodiment and a semiconductor device according to a conventional art are operated at the same drain voltage ($V_{ds}$=10 V). As will be clear from FIG. 1E, it has been confirmed that $V_P$ can take a positive value in the semiconductor device according to the present embodiment shown by the solid line unlike the semiconductor device according to the conventional art shown by the dotted line. Meanwhile, a curve a is for an undoped case at the aluminum composition ratio of x=y, a curve b is for an undoped case at the aluminum composition ratio of x<y, and a curve c is for a doped case at the aluminum composition ratio of x=y. In addition, the conventional example is shown by a curve using the structure shown in FIG. 5.

Symbol x is the aluminum composition ratio of the barrier layer 13, and symbol y is the aluminum composition ratio of the semiconductor layer 17. From the curves a and c, it has been confirmed that the semiconductor device whose semiconductor layer 17 is doped takes $I_{max}$ higher than that of the semiconductor device whose semiconductor layer 17 is not doped.

In addition, from the curves a and b, setting the aluminum composition ratio y of the semiconductor layer 17 larger than the aluminum composition ratio x of the barrier layer 13 will lead to an increase in the concentration of the two-dimensional electron gas (2DEG) by the polarization in a channel portion while keeping the normally-off mode, resulting in an increase in $I_{max}$.

Figure 1F:
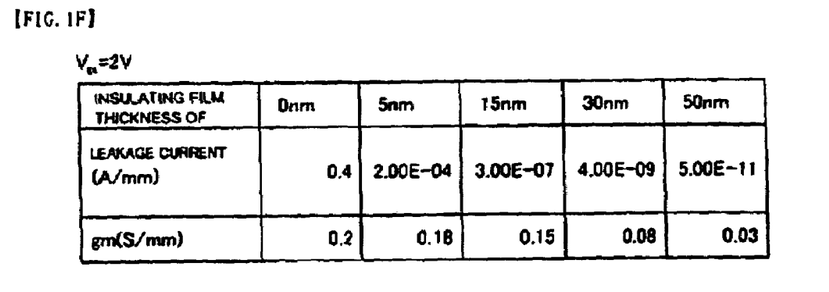
FIG. 1F is a table showing a relationship between a gate leakage current and $g_m$ with respect to a thickness of an insulating film.

FIG. 1F shows in a table form a gate leakage current and $g_m$ when the thickness of the insulating film 18 is 0 nm to 50 nm. It can be confirmed from this table that if the insulating film 18 is thinner than 5 nm, the gate leakage current will be increased more than needs, meanwhile if it is thicker than 30 nm, $g_m$ will be decreased more than the needs. Hence, it will be understood that the thickness of the insulating film 18 is preferably equal to or more than 5 nm, and equal to or less than 30 nm. Here, the leakage current is expressed by for example 2.00 E−04=2×10$^{-4}$.

In addition, the insulating film 18 is supposed to have a dielectric constant higher than that of the barrier layer. Moreover, an upper limit will not be set to the dielectric constant of the insulating film 18 unless the insulation is damaged. Such structure makes it possible to achieve higher $I_{max}$ and $g_m$, and lower gate leakage current as compared with those of the HFET (FIG. 5) of the conventional normally-on mode.

As a material of the insulating film 18, a thin film of strontium titanate (STO), barium titanate strontium (BST), oxidation hafnium (HfO$_2$), aluminum oxide (Al$_2$O$_3$), magnesium oxide (MgO), aluminum nitride (AlN), zirconium oxide (ZrO$_2$), or oxidation gallium nitride (GaN$_x$O$_y$) may be selected. Employing such structure makes it possible to achieve higher $I_{max}$ and $g_m$, and lower gate leakage current.

(Second Embodiment)

Figure 2A:
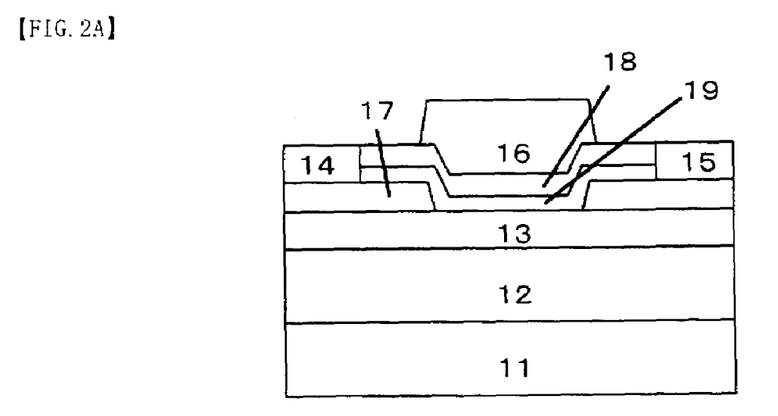
FIG. 2A is a sectional view showing a semiconductor device according to a second embodiment of the present invention.
Figure 2B:
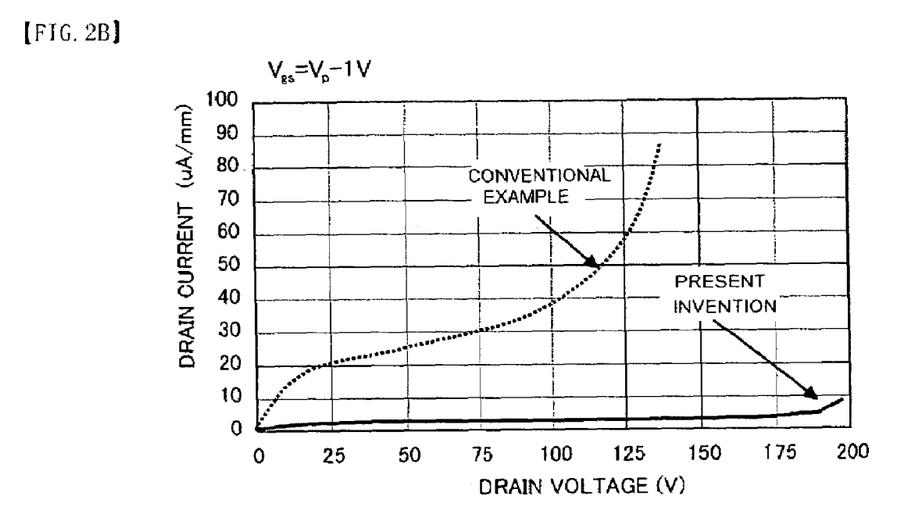
FIG. 2B is a graph showing drain current-drain voltage characteristics of the semiconductor device according to the present invention and the semiconductor device according to the conventional art.

Referring to FIG. 2A and FIG. 2B, a second embodiment according to the present invention will now be described. The second embodiment, which is obtained by further improving the first embodiment, makes it possible to achieve the normally-off mode and obtain a high breakdown voltage.

FIG. 2A schematically shows a cross section of a semiconductor device according to the second embodiment.

As shown in FIG. 2A, on the operation layer 12 composed of GaN formed on the substrate 11, a barrier layer 13 composed of Al$_x$Ga$_{(1-x)}$N (0<x<1), which has a thickness and an aluminum composition ratio such that an energy at the bottom of a conduction band on the surface of the operation layer 12 directly under a gate electrode is higher than a Fermi energy in that location is stacked, and a heterojunction interface is formed of the operation layer 12 and the barrier layer 13. On the barrier layer 13, a semiconductor layer 17 composed of Al$_y$Ga$_{(1-y)}$N (0<y<1) is further stacked, a source ohmic electrode 14 and a drain ohmic electrode 15 are formed thereon apart from each other, an insulating film 19 having a high dielectric breakdown voltage is formed between the source ohmic electrode 14 and the drain ohmic electrode 15, an insulating film 18 having a dielectric constant higher than that of the barrier layer 13 is formed thereon, and a gate electrode 16 is formed thereon. It should be noted that, in the second embodiment, the semiconductor layer 17 is not stacked in a portion where the gate electrode 16 is formed.

FIG. 2B shows a drain current-drain voltage ($I_{ds}$-$V_{ds}$) curve of the semiconductor device according to the present embodiment and the semiconductor device according to the conventional art. As will be clear from FIG. 2B, it has been confirmed that the semiconductor device according to the present embodiment shown by the solid line could achieve a higher breakdown voltage as compared with the semiconductor device according to the conventional art shown by the dotted line.

In addition, as a material of the insulating film 19, a thin film of silicon oxide (SiO$_2$), silicon nitride (Si$_3$N$_4$), or organic macromolecule (BCB, BCN) may be selected. Employing such structure can provide the advantages similar to those of the first embodiment, while achieving a high breakdown voltage.

(Third Embodiment)

Figure 3A:
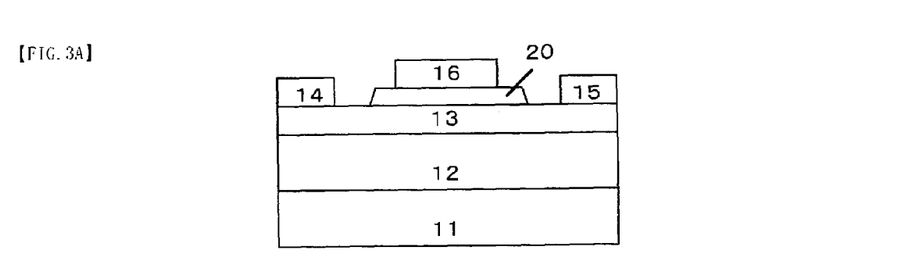
FIG. 3A is a sectional view showing a semiconductor device according to a third embodiment of the present invention.
Figure 3B:
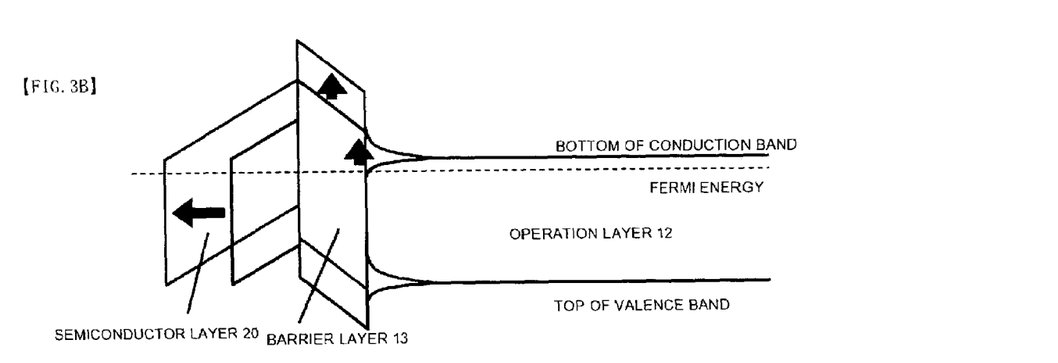
FIG. 3B is a graph showing an energy band directly under a gate electrode when a gate voltage of the semiconductor device according to the present invention is 0 V.
Figure 3C:
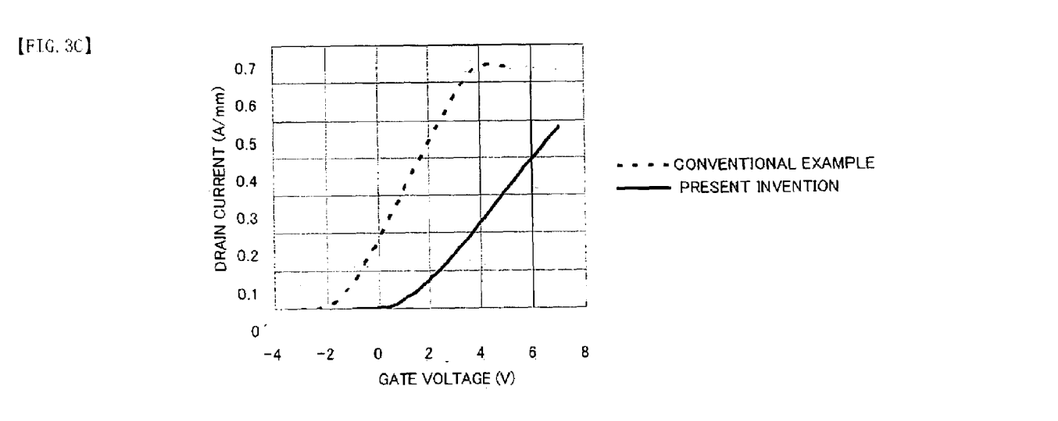
FIG. 3C is a graph showing drain current-gate voltage characteristics of the semiconductor device according to the present invention and a semiconductor device according to the conventional art.

Referring to FIG. 3A through FIG. 3C, a semiconductor device according to a third embodiment of the present invention will be now described.

FIG. 3A schematically shows a cross section of the semiconductor device according to the present embodiment.

As shown in FIG. 3A, a barrier layer 13 composed of Al$_x$Ga$_{(1-x)}$N (0<x<1) is stacked on an operation layer 12 composed of GaN formed on a substrate 11, and a heterojunction interface is formed of the operation layer 12 and the barrier layer 13. On the barrier layer 13, a source ohmic electrode 14 and a drain ohmic electrode 15 are formed apart from each other, a semiconductor layer 20 (x>y) composed of Al$_y$Ga$_{(1-y)}$N (0<y<1) is formed between the source ohmic electrode 14 and the drain ohmic electrode 15, where the Al$_y$Ga$_{(1-y)}$N (0<y<1) has a thickness such that an energy at the bottom of a conduction band on a surface of the operation layer 12 directly under a gate electrode is higher than a Fermi energy in that location, and has an aluminum composition ratio smaller than that of the barrier layer 13, and a gate electrode 16 is formed thereon.

The configuration of the semiconductor device according to the third embodiment can set a threshold voltage $V_P$ to be a positive value. It is because, as shown in FIG. 3B, due to polarization charges generated in a hetero-interface between the barrier layer 13 and the semiconductor layer 20, an increase in the thickness of the semiconductor layer 20 results in an increase in the energy at the bottom of the conduction band on the surface of the operation layer 12 directly under the gate electrode 16.

FIG. 3C shows a drain current-gate voltage ($I_{ds}$-$V_{gs}$) curve where both of the semiconductor device according to the present embodiment and the semiconductor device according to the conventional art are operated at the same drain voltage ($V_{ds}$=10 V). As will be clear from FIG. 3C, it has been confirmed that $V_P$ in the semiconductor device according to the third embodiment shown by the solid line could take a positive value as compared with the semiconductor device according to the conventional art shown by the dotted line.

As described above, in the semiconductor device according to the third embodiment, stacking the semiconductor layer 20 makes it possible to achieve the normally-off mode.

(Fourth Embodiment)

Figure 4:
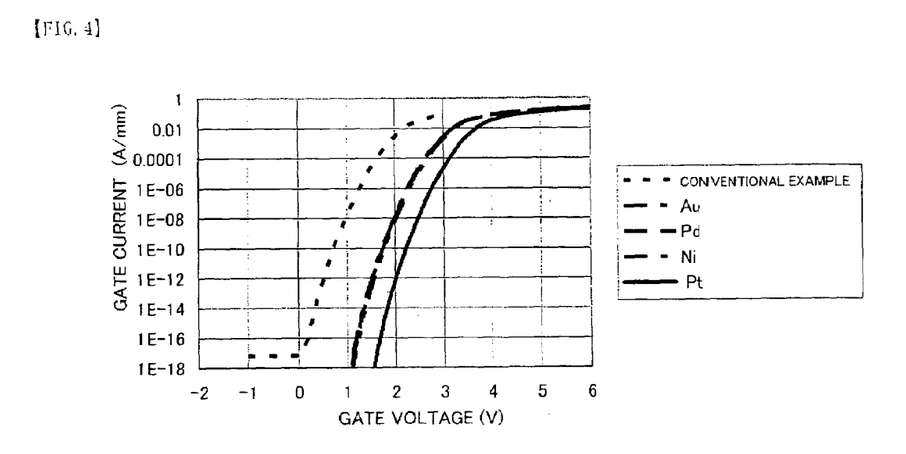
FIG. 4 is a graph showing gate current-gate voltage characteristics of a semiconductor device according to the present invention and a semiconductor device according to the conventional art in a semiconductor device in accordance with a fourth embodiment of the present invention.

Referring to FIG. 1A and FIG. 4, a fourth embodiment according to the present invention will finally be described. In short, while achieving the normally-off mode, a reduction in gate leakage current can be made by improving the first embodiment.

FIG. 1A schematically shows a cross section of a semiconductor device according to the fourth embodiment.

As shown in FIG. 1A, on an operation layer 12 composed of GaN formed on a substrate 11, a barrier layer 13 composed of $Al_xGa_{(1-x)}N$ (0<x<1), which has a thickness and an aluminum composition ratio such that an energy at the bottom of a conduction band on a surface of the operation layer 12 directly under a gate electrode is higher than a Fermi energy in that location is stacked, and a heterojunction interface is formed of the operation layer 12 and the barrier layer 13. On the barrier layer 13, a semiconductor layer 17 composed of $Al_yGa_{(1-y)}N$(0<y<1) is further stacked, a source ohmic electrode 14 and a drain ohmic electrode 15 are formed thereon apart from each other, and a gate electrode 16 is formed between the source ohmic electrode 14 and the drain ohmic electrode 15. It should be noted that, in the fourth embodiment, the semiconductor layer 17 is not stacked in a portion where the gate electrode 16 is formed.

As a material of the gate electrode 16 in the fourth embodiment, nickel (Ni), palladium (Pd), palladium silicon (PdSi), platinum (Pt), gold (Au), or alloys or multilayer films composed of them is selected.

FIG. 4 shows a gate current-gate voltage ($I_g$-$V_{gs}$) curve where both of the semiconductor device according to the fourth embodiment and the semiconductor device according to the conventional art are operated at the same drain voltage ($V_{ds}$=10 V). As will be clear from FIG. 4, it has been confirmed that the semiconductor device according to the fourth embodiment shown by the solid line could achieve a lower gate current as compared with the semiconductor device according to the conventional art shown by the dotted line.

It should be noted that the selection of the gate electrode of the fourth embodiment might also be applied to the first through the third embodiments.

In the group III nitride semiconductor device having the source, drain, and gate electrodes, the semiconductor device according to the present invention has the thin barrier layer directly under the gate electrode, the film having a high dielectric constant on the barrier layer, and the barrier layer having the thickness similar to that of the conventional one by re-growth of the barrier layer, between the source and gate electrodes, and between the gate and drain electrodes. As a result, the film having the high dielectric constant and the barrier layer thinner than the conventional one makes it possible to achieve higher $g_m$, while achieving higher $I_{max}$ in the normally-off mode as comparison with the semiconductor device according to the conventional art. The present invention is therefore useful for a semiconductor device using a group III nitride semiconductor, especially for a power transistor or the like for which a high breakdown voltage is required in a power supply system, and the industrial value thereof is very high.

What is claimed is:

1. A semiconductor device comprising: a substrate on which a first group III nitride semiconductor layer serving as an operation layer is formed; a second group III nitride semiconductor layer composed of a single layer or a plurality of layers, the second group III nitride semiconductor layer is formed on said first group III nitride semiconductor layer and functions as the barrier layer; a third group III nitride semiconductor layer which is not formed only at a gate forming region on said second group III nitride semiconductor layer; a first electrode which is formed on said third group III nitride semiconductor layer and functions as a source; a second electrode which is formed on said third group III nitride semiconductor layer and functions as a drain; an insulating film layer formed on said second and third group III nitride semiconductor layers between said first electrode and said second electrode; and a third electrode (gate) which is formed on said insulating film layer and controls a current flowing between said first electrode and said second electrode, wherein said second group III nitride semiconductor layer contains aluminum, and has a thickness and an aluminum composition ratio that are controlled so that, in the state where a voltage is not applied to said third electrode with respect to said first electrode, an energy at the bottom of a conduction band on a surface of said first group III nitride semiconductor layer directly under said third electrode may be higher than a Fermi energy in the location.

2. The semiconductor device according to claim 1, wherein impurities are doped in said third group III nitride semiconductor layer.

3. The semiconductor device according to claim 1, wherein said third group III nitride semiconductor layer includes aluminum, and an aluminum composition ratio thereof is equal to or higher than that of said second group III nitride semiconductor layer.

4. The semiconductor device according to claim 1, wherein a dielectric constant of said insulating film layer is larger than that of said second group III nitride semiconductor layer.

5. The semiconductor device according to claim 1, wherein said insulating film layer may be a strontium titanate (STO), barium titanate strontium (BST), oxidation hafnium ($HfO_2$), aluminum oxide ($Al_2O_3$), magnesium oxide (MgO), aluminum nitride (AlN), zirconium oxide ($ZrO_2$), or oxidation gallium nitride ($GaN_xO_y$) thin film.

6. The semiconductor device according to claim 1, wherein a thickness of said insulating film layer is equal to or more than 5 nm and equal to or less than 30 nm.

7. A semiconductor device comprising: a substrate on which a first group III nitride semiconductor layer serving as an operation layer is formed; a second group III nitride semiconductor layer composed of a single layer or a plurality of layers, the second group III nitride semiconductor layer is formed on said first group III nitride semiconductor layer and functions as the barrier layer; a third group III nitride semiconductor layer which is not formed only at a gate forming region on said second group III nitride semiconductor layer; a first electrode which is formed on said third group III nitride semiconductor layer and functions as a source; a second electrode which is formed on said third group III nitride semiconductor layer and functions as a drain; a first insulating film layer which is formed on said second and third group III nitride semiconductor layers between said first electrode and said second electrode and has a high dielectric breakdown voltage; a second insulating film layer which is formed on said first insulating film layer and has a dielectric constant higher than that of said second group III nitride semiconductor layer; a third electrode (gate) which is formed on said second insulating film layer and controls a current flowing between said first electrode and said second electrode, wherein said second group III nitride semiconductor layer contains aluminum, and has a thickness and an aluminum composition ratio that are controlled so that, in the state where a voltage is not applied to said third electrode with respect to said first electrode, an energy at the bottom of a conduction band on a surface of said first group III nitride semiconductor layer directly under said third electrode may be higher than a Fermi energy in the location.

8. The semiconductor device according to claim 7, wherein said first insulating film layer may be a silicon oxide ($SiO_2$), silicon nitride ($Si_3N_4$), or organic macromolecule (BCB, BCN) thin film.

9. The semiconductor device according to claim 1, wherein nickel (Ni), palladium (Pd), palladium silicon (PdSi), platinum (Pt), gold (Au), or alloys or multilayer films composed of them may be used as said third electrode.

10. The semiconductor device according to claim 7, wherein nickel (Ni), palladium (Pd), palladium silicon (PdSi), platinum (Pt), gold (Au), or alloys or multilayer films composed of them may be used as said third electrode.

* * * * *